(12) United States Patent
Greenwald et al.

(10) Patent No.: US 6,929,339 B1
(45) Date of Patent: Aug. 16, 2005

(54) LATCH CONTROLLER FOR QUICK-MOUNT SUPPORT FOR TELESCOPING SLIDE

(75) Inventors: William B. Greenwald, Beech Grove, IN (US); Jeff L. Naue, New Palestine, IN (US); Phillip B. Cutler, Westfield, IN (US)

(73) Assignee: General Devices Co., Inc., Indianapolis, IN (US)

( * ) Notice: Subject to any disclaimer, the term of this patent is extended or adjusted under 35 U.S.C. 154(b) by 0 days.

(21) Appl. No.: 10/787,711

(22) Filed: Feb. 26, 2004

(51) Int. Cl.$^7$ ............................................. A47D 88/00
(52) U.S. Cl. ............................... 312/334.4; 312/223.1; 211/26
(58) Field of Search ...................... 312/334.4, 334.5, 312/330.1, 265.1, 265.4, 223.1, 334.7, 350; 211/26; 384/22; 361/725, 727

(56) References Cited

U.S. PATENT DOCUMENTS

| | | |
|---|---|---|
| 516,583 A | 3/1894 | Adkins |
| 1,698,252 A | 1/1929 | Ashe |
| 2,644,588 A | 7/1953 | Brown |
| 2,749,200 A | 6/1956 | Kuss |
| 2,809,086 A | 10/1957 | Fall |
| 3,054,511 A | 9/1962 | Erismann |
| 3,133,768 A | 5/1964 | Klakovich |
| 3,601,432 A | 8/1971 | Fenwick et al. |
| 4,049,230 A | 9/1977 | Minniear |
| 4,106,738 A | 8/1978 | Kostecky |
| 4,423,914 A | 1/1984 | Vander Ley |
| 4,441,722 A | 4/1984 | Pichler |
| 4,441,772 A | 4/1984 | Fielding et al. |
| 4,474,492 A | 10/1984 | Fleitas |
| 5,063,715 A | 11/1991 | Goodman |
| 5,199,777 A | 4/1993 | Taima et al. |
| 5,292,198 A | 3/1994 | Rock et al. |
| 5,405,195 A | 4/1995 | Hobbs |
| 5,433,517 A | 7/1995 | Fleisch |
| 5,580,138 A | 12/1996 | Grabher |
| 5,620,244 A | 4/1997 | Yang |
| 5,632,542 A | 5/1997 | Krivec |
| 5,671,988 A | 9/1997 | O'Neill |
| 5,683,159 A | 11/1997 | Johnson |
| 5,730,514 A | 3/1998 | Hashemi |
| 5,823,648 A | 10/1998 | Domenig |
| 5,904,412 A | 5/1999 | Lammens |
| 6,027,194 A | 2/2000 | Fleisch |
| 6,209,979 B1 | 4/2001 | Fall et al. |
| 6,273,534 B1 | 8/2001 | Bueley et al. |
| 6,422,399 B1 | 7/2002 | Castillo et al. |
| 6,749,275 B2 * | 6/2004 | Cutler et al. ............. 312/334.4 |
| 2004/0089779 A1 * | 5/2004 | Greenwald et al. ......... 248/241 |
| 2004/0094492 A1 * | 5/2004 | Greenwald et al. ........... 211/26 |

FOREIGN PATENT DOCUMENTS

CA            817754         7/1969

* cited by examiner

*Primary Examiner*—Janet M. Wilkens
(74) *Attorney, Agent, or Firm*—Barnes & Thornburg LLP

(57) ABSTRACT

A telescoping slide support assembly includes a telescoping slide assembly, a vertical rack for use in an equipment cabinet, and a quick-mount support coupled to a stationary slide included in the telescoping slide assembly. The quick-mount support includes a latch that is movable to facilitate coupling and uncoupling of the quick-mount support and the vertical rack.

15 Claims, 6 Drawing Sheets

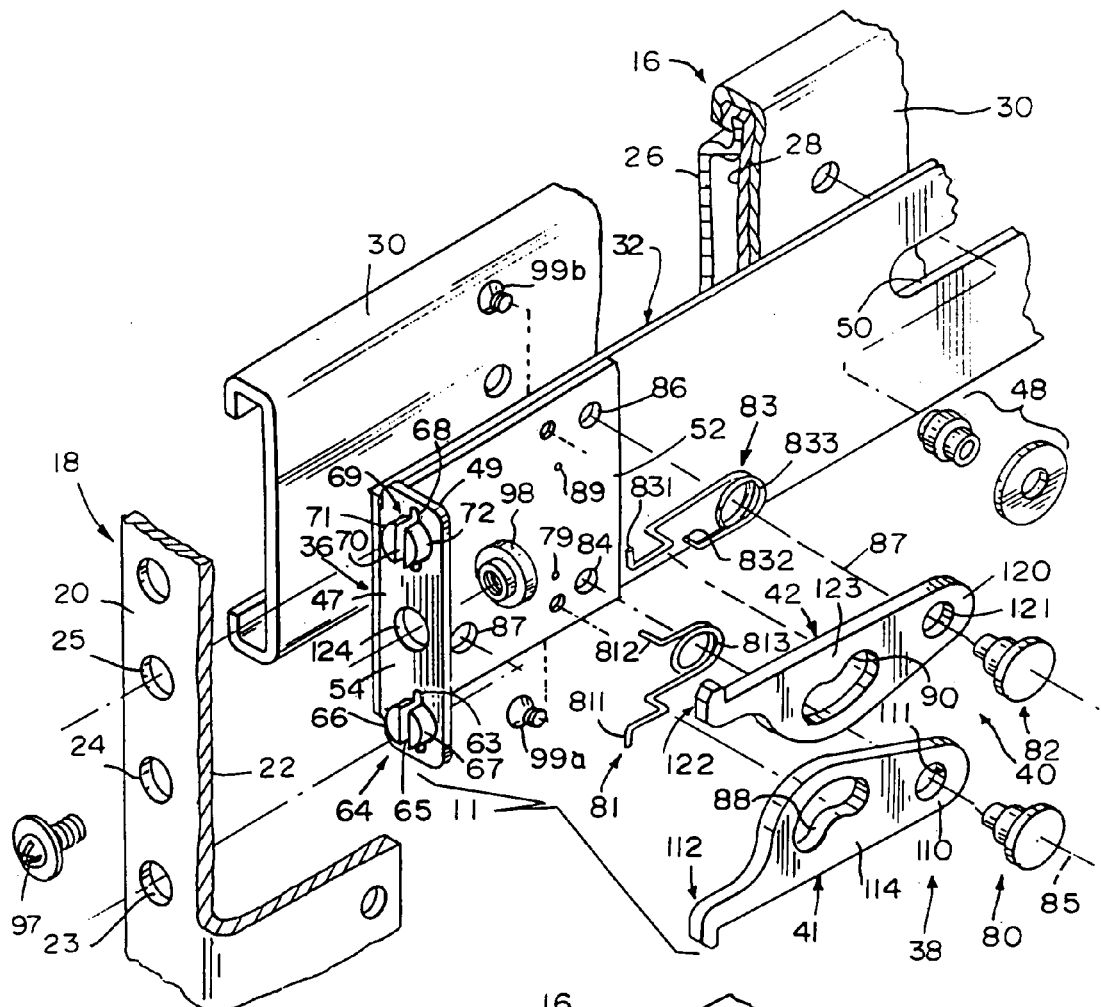
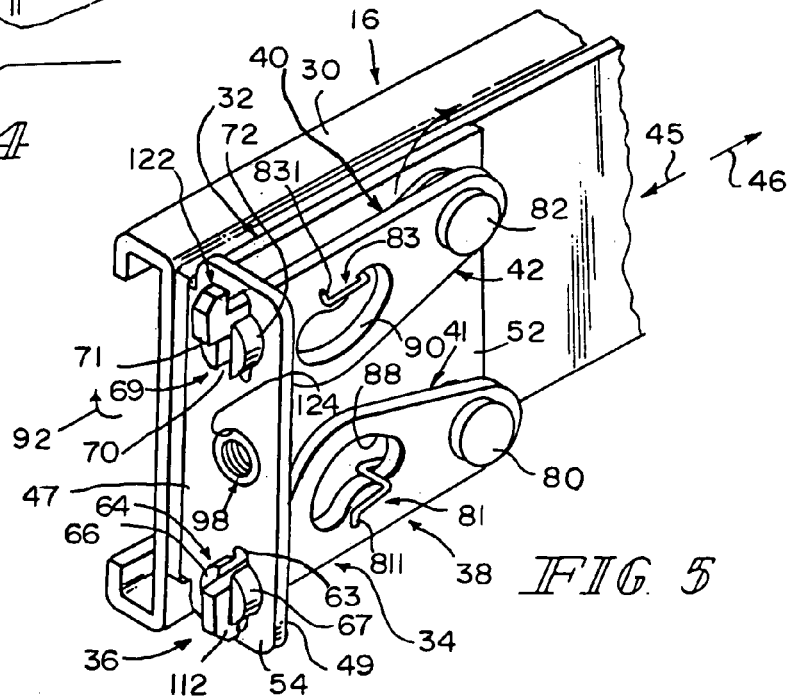
FIG. 4
FIG. 5

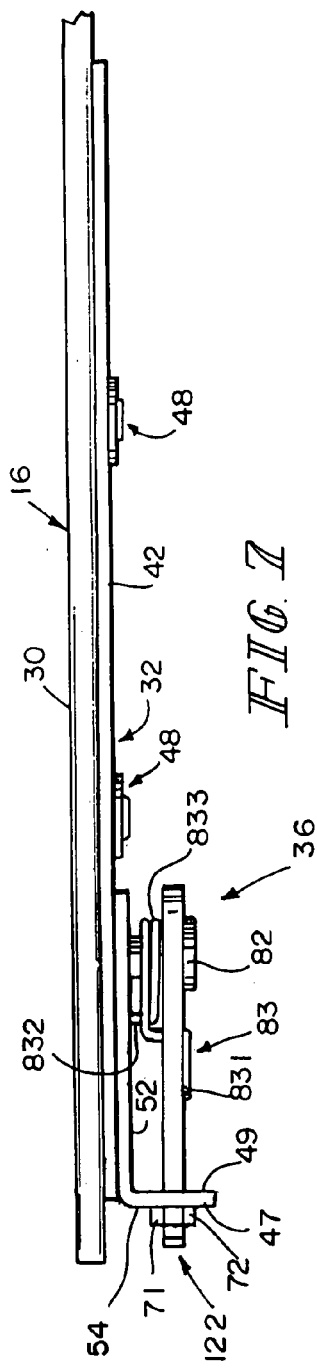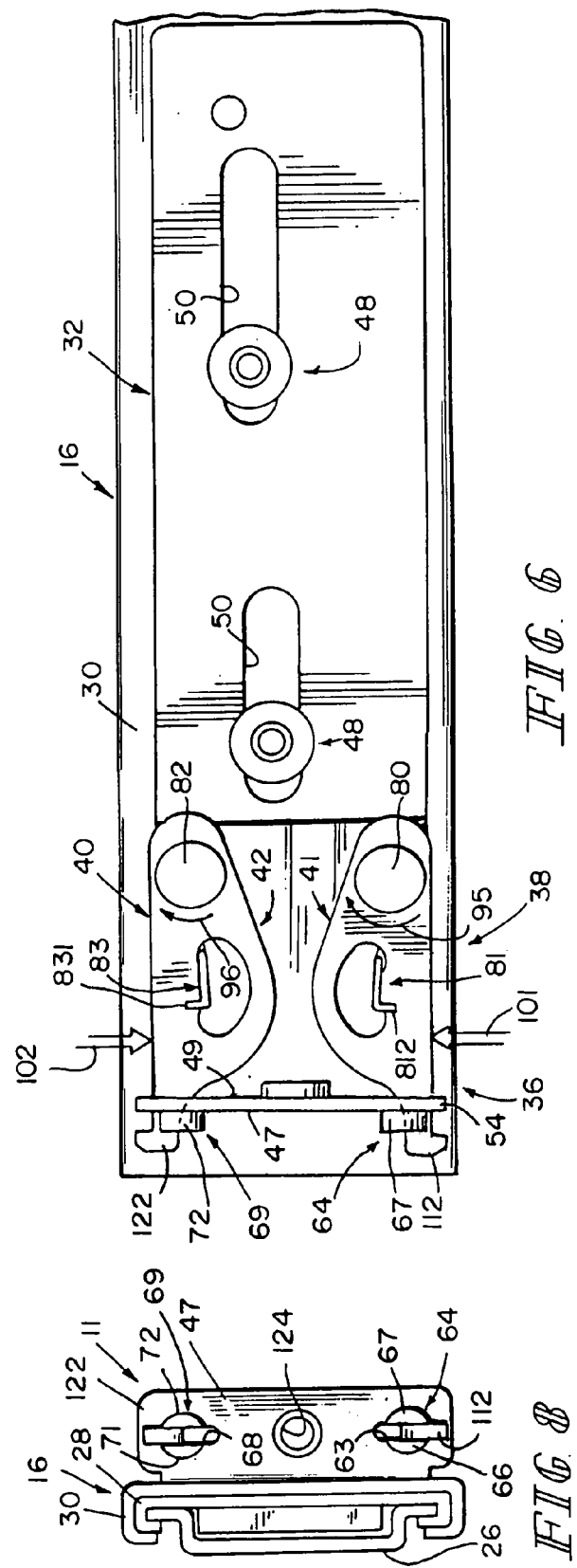

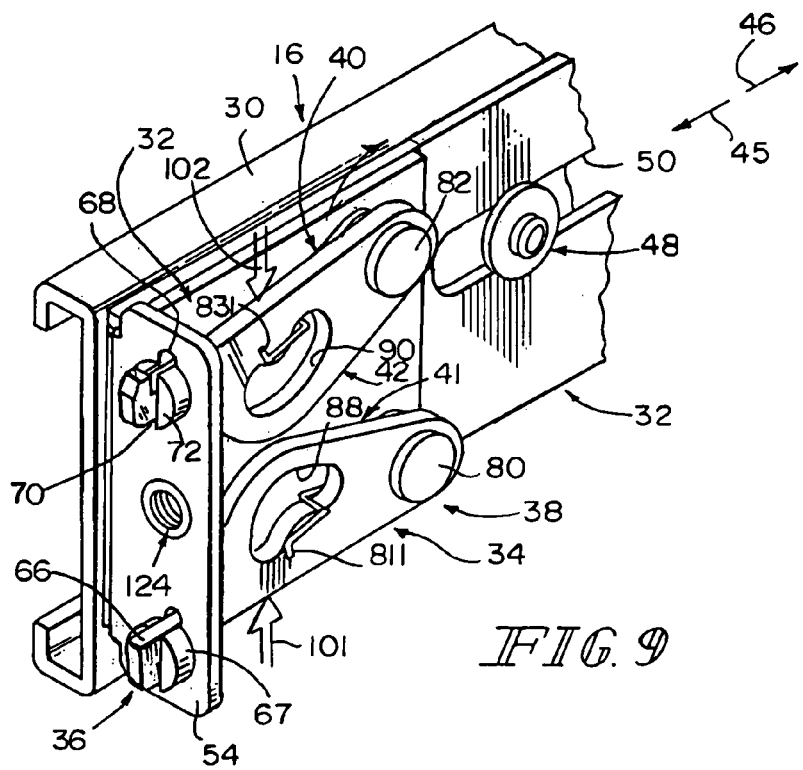
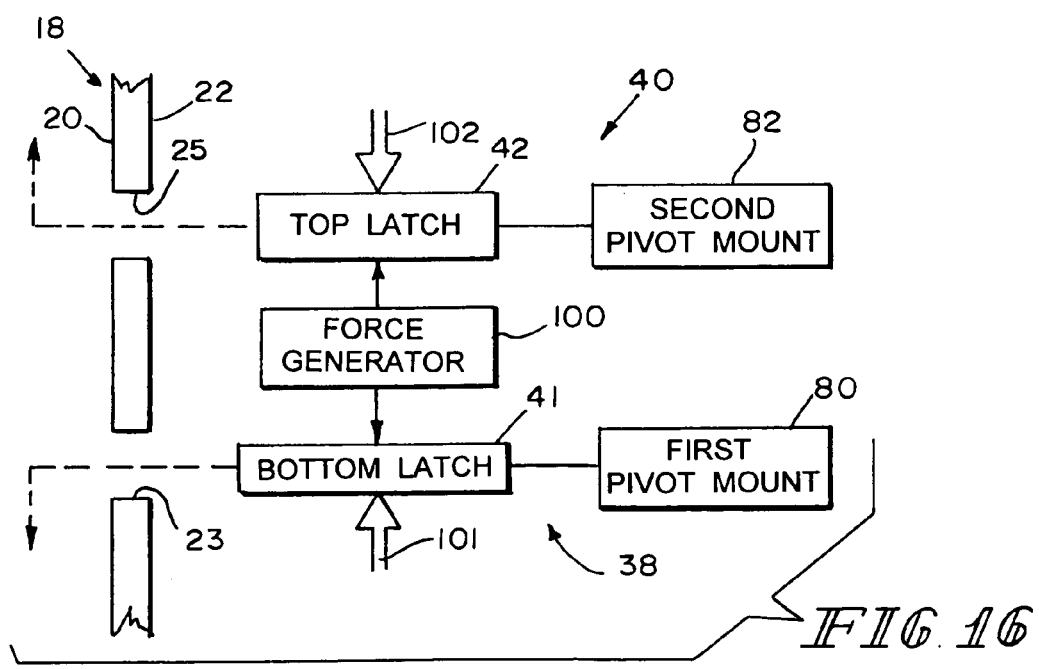

LATCH CONTROLLER FOR QUICK-MOUNT SUPPORT FOR TELESCOPING SLIDE

BACKGROUND

The present disclosure relates to telescoping slide assemblies, and particularly to telescoping slide assemblies mounted on racks to support a piece of equipment for movement relative to the rack. More particularly, the present disclosure relates to bracket systems for mounting telescoping slide assemblies on racks included in an equipment cabinet.

A telescoping slide assembly support system in accordance with the present disclosure includes a telescoping slide assembly, a rack for use in an equipment cabinet, and a quick-mount support coupled to a stationary slide in the telescoping slide assembly. The quick-mount support is configured to be coupled quickly and easily to facilitate mounting the stationary slide in a fixed position relative to the rack. A load-carrying slide also included in the telescoping slide assembly can be coupled to a piece of equipment to support that equipment for movement relative to the rack into and out of the equipment cabinet.

In illustrative embodiments of the present disclosure, the quick-mount support includes a movable bottom latch arranged to extend through a first of a series of latch apertures formed in the rack and a movable top latch arranged to extend through a second of the latch apertures formed in the rack. A force generator is coupled to the bottom and top latches and arranged to move the bottom and top latches away from one another while the bottom latch extends through the first of the latch apertures and the top latch extends through the second of the latch apertures to mate the bottom and top latches with the rack to block uncoupling of the quick-mount support and the rack.

The force generator includes a first spring arranged to urge the bottom latch normally away from the top latch and a second spring arranged to urge the top latch normally away from the bottom latch. The bottom latch is mounted on the mount unit for pivotable movement about a first latch pivot axis and the top latch is mounted on the mount unit for pivotable movement about a second latch pivot axis. An alignment guide is associated with each of the bottom and top latches and configured to extend into latch apertures formed in the rack to help guide the bottom and top latches into those latch apertures.

The quick-mount support further includes a first split-cylinder alignment guide associated with the bottom latch and a second split-cylinder alignment guide associated with the top latch. Each latch extends through and is movable in a channel formed in its companion split-cylinder alignment guide to engage or disengage the rack. Each split-cylinder alignment guide extends through one of the latch apertures formed in the rack to orient the quick-mount support in a predetermined position relative to the rack to facilitate coupling of the quick-mount support to the rack.

Features of the present disclosure will become apparent to those skilled in the art upon consideration of the following detailed description of illustrative embodiments exemplifying the best mode of carrying out the disclosure as presently perceived.

BRIEF DESCRIPTION OF THE DRAWINGS

The detailed description particularly refers to the accompanying figures in which:

FIG. 4 is an enlarged perspective assembly view of various components that can be assembled as shown, for example, in FIG. 5, to produce a quick-mount support in accordance with this disclosure;

FIG. 5 is an enlarged perspective view of the quick-mount support of FIG. 4 after it has been assembled and mounted on one end of a stationary slide included in the three-part telescoping slide assembly and showing pivotable top and bottom pivotable latches, each latch having a latch lug extending through a slot formed in a mount unit and out of a channel formed in a split-cylinder alignment guide, the pivotable bottom latch being urged by a first spring to a "lowered and locked" position, the pivotable top latch being urged by a second spring to a "raised and locked" position;

FIG. 6 is an enlarged side elevation view of the quick-mount support of FIG. 5 showing the pivotable top and bottom latches urged by the springs to their normal spread-apart positions extending out of the channels formed in the two split-cylinder alignment guides;

FIG. 7 is a top plan view of the unit shown in FIG. 6;

FIG. 8 is a front end view of the unit shown in FIG. 6;

FIG. 9 is a perspective view of the quick-mount support similar to FIG. 5 showing pivoting movement of the top and bottom latches toward one another into the channels formed in the split-cylinder alignment guides (in response to opposing forces applied manually by a user that is acting to "squeeze" the top and bottom latches) prior to coupling the quick-mount support to the rack;

FIG. 16 is a diagrammatic illustration showing a "force generator" arranged to move top and bottom latches included in the quick-mount support normally away from one another and showing use of two opposing external forces (represented by double arrows) to move the top and bottom latches toward one another against the forces applied by the force generator to ready the quick-mount support to be mounted on a rack.

DETAILED DESCRIPTION

Figure 1:
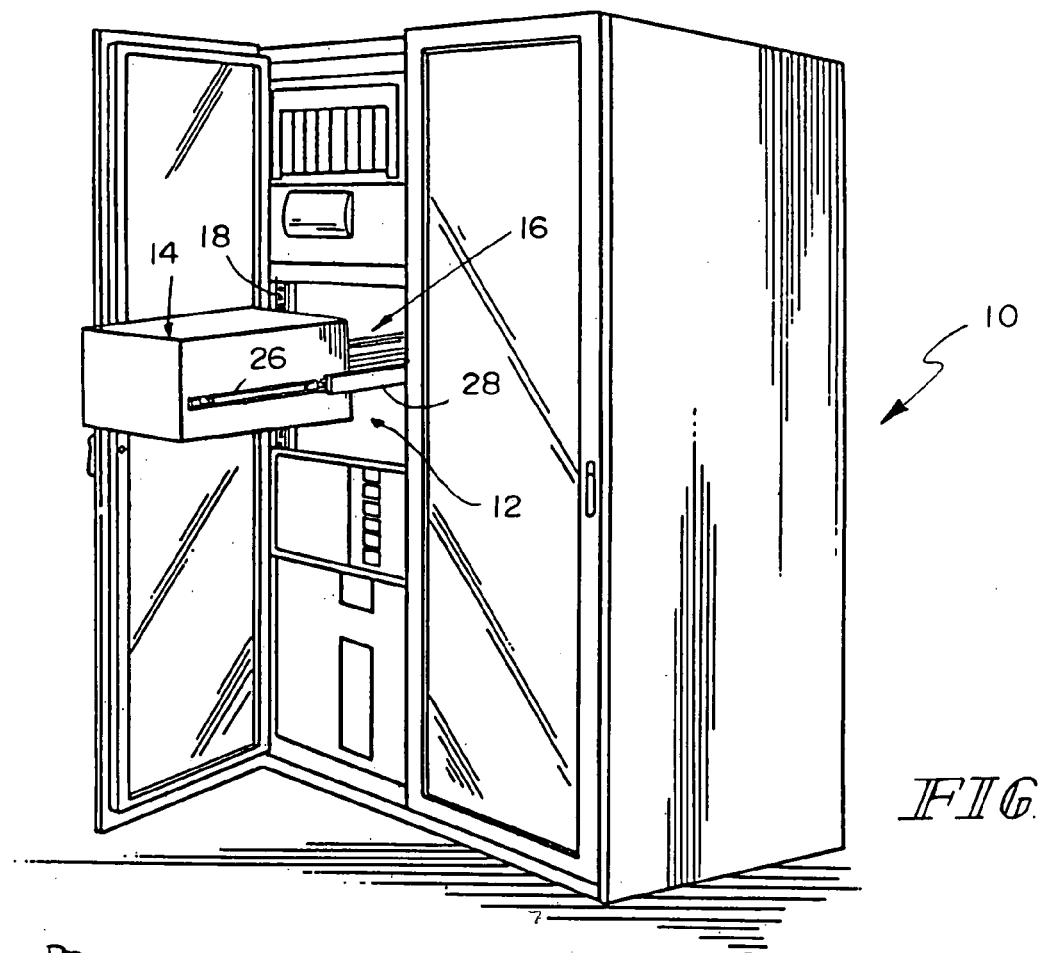
FIG. 1 is a perspective view showing a piece of equipment mounted on two fully extended telescoping slide assemblies that are mounted on vertical racks provided inside a cabinet to enable a technician to move the piece of equipment easily into and out of the cabinet.
Figure 2:
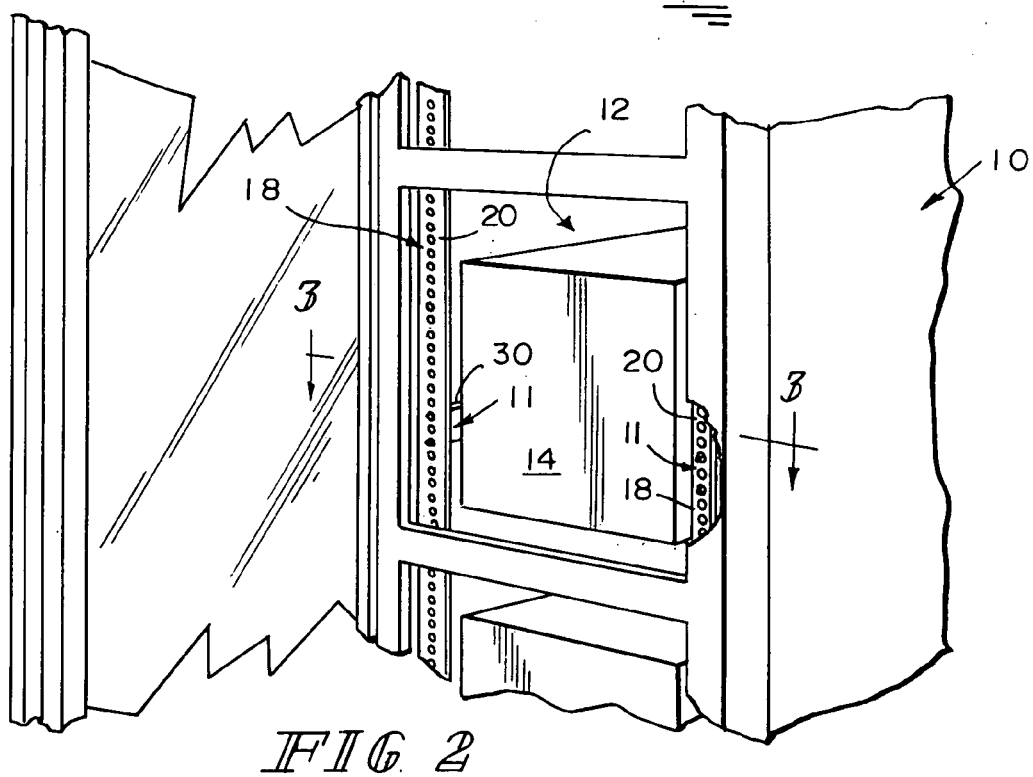
FIG. 2 is a partial perspective view of the cabinet of FIG. 1, with portions broken away, showing the piece of equipment located inside the cabinet owing to the full retraction of the telescoping slide assemblies inside the cabinet and showing two forward vertical racks and a series of latch apertures formed in each of the forward vertical racks wherein two latches associated with a quick-mount support coupled to a "left-side" slide assembly extend into two of the latch apertures formed in a left-side forward vertical rack and two latches associated with a quick-mount support coupled to a "right-side" slide assembly extend into two of the latch apertures formed in a right-side forward vertical rack.

An equipment cabinet 10 includes an interior region 12 adapted to store equipment therein as shown, for example, in FIGS. 1 and 2. A piece of equipment 14 is mounted on a pair of spaced-apart telescoping slide assemblies 16 for movement thereon between a fully extended position away from cabinet 10 as shown in FIG. 1 and a fully retracted position within cabinet 10 as shown in FIG. 2. Vertical racks 18 are mounted in cabinet 10 as shown, for example, in FIGS. 1–3 and telescoping slide assemblies 16 are mounted to these vertical racks 18 using the quick-mount support system disclosed herein and shown, for example, in FIGS. 4–16.

Each vertical rack 18 includes a forwardly facing surface 20, a rearwardly facing surface 22, and a series of latch apertures 23, 24, 25, etc., as shown, for example, in FIGS. 4 and 10–16. Each vertical rack 18 is coupled to equipment cabinet 10 and positioned to lie in the interior region 12 as shown, for example, in FIG. 3. It is within the scope of this disclosure to configure and orient rack 18 to support slide assemblies in a wide variety of locations within cabinet 10. In many instances, rack 18 will have a "vertical" orientation but other orientations fall within the scope of this disclosure.

Telescoping slide assembly 16 includes any suitable number of slides. In the illustrations, telescoping slide assembly 16 includes interconnected load-carrying slide 26, intermediate slide 28, and stationary slide 30. These slides 26, 28, and 30 are movable relative to one another to extend and retract load-carrying slide 26 relative to stationary slide 30 between fully extended and retracted positions as suggested in FIGS. 1 and 2. Piece of equipment 14 is coupled to spaced-apart load-carrying slides 26 in any suitable manner as shown, for example, in FIG. 3. It is within the scope of this disclosure to omit intermediate slide 28 or add additional intermediate slides (not shown).

A pair of quick-mount supports 11 is provided so that each end of each stationary slide 30 can be mounted to an adjacent vertical rack 18 quickly and easily. Thus, the telescoping slide assemblies 16 used to support equipment 14 are positioned to lie in spaced-apart parallel relation to one another in fixed positions on vertical racks 18. Quick-mount support 11 can be operated quickly and easily by a technician provided with access to interior region 12 of equipment cabinet 10 to couple quick-mount support 11 to vertical rack 18 as shown in FIGS. 11, 13, and 15.

Figures 10, 11:
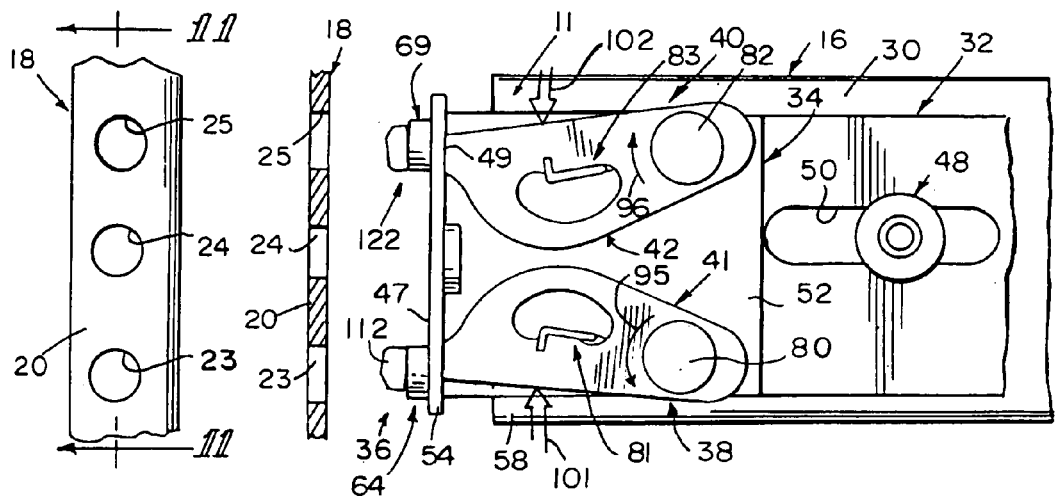
FIG. 10 is an elevation view of the vertical rack shown in FIG. 4 showing a "perforated" front wall formed to include three latch apertures.
FIG. 11 is a sectional view taken along line 11—11 of FIG. 10 and showing the quick-mount support of FIGS. 4–9 before it is coupled to the perforated front wall of the vertical rack and showing "raising" of the pivotable bottom latch and "lowering" of the pivotable top latch so that each of those latches is poised to pass into one of the latch apertures formed in the front wall of the vertical rack.
Figures 12, 13:
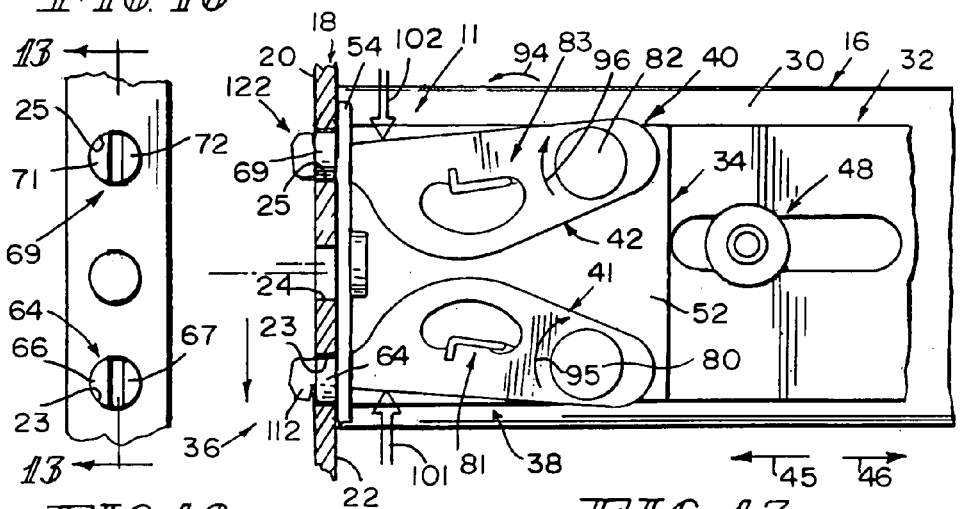
FIG. 12 is an elevation view similar to FIG. 10 showing placement of a first split-cylinder alignment guide and a latch lug of the bottom latch in a first of the latch apertures formed in the rack and placement of a second split-cylinder alignment guide and a latch lug of the top latch in a second of the latch apertures formed in the rack.
FIG. 13 is a sectional view similar to FIG. 11 taken along line 13—13 of FIG. 12 showing horizontal movement of a mounting bracket in the quick-mount support to engage the perforated front wall of the vertical rack and to extend the raised bottom latch (and its companion split-cylinder alignment guide) into one of the latch apertures formed in the front wall and to extend the lowered top latch (and its companion split-cylinder alignment guide) into another of the latch apertures.
Figures 14, 15:
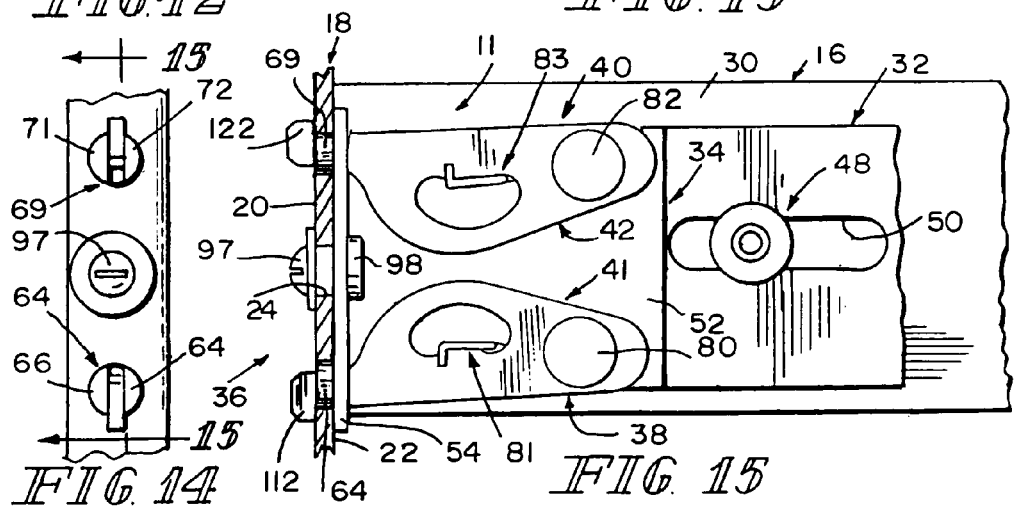
FIG. 14 is an elevation view similar to FIG. 12 showing "downward" movement of the latch lug of the pivotable bottom latch and "upward" movement of the latch lug of the pivotable top latch.
FIG. 15 is a sectional view similar to FIGS. 11 and 13 taken along line 15—15 of FIG. 14 showing the quick-mount support anchored to the vertical rack after spring-biased pivoting movement of the bottom latch to the lowered and locked position and spring-biased pivoting movement of the top latch to the raised and locked position to cause the stationary slide of the telescoping slide assembly to be held in a fixed position relative to the vertical rack provided in the cabinet as shown in FIGS. 2 and 3.

Quick-mount support 11 includes a slide support bracket 32 coupled to stationary slide 30 and a retainer mechanism 34 coupled to slide support bracket 32 and configured to mate easily to vertical rack 18 so that quick-mount support 11 can be coupled to and uncoupled from vertical rack 18 quickly and easily in a manner suggested in FIGS. 11, 13, and 15. Fasteners 48 can be arranged to extend through apertures or position-adjustment slot 50 formed in slide support bracket 32 to engage stationary slide 30 so that slide support bracket 32 is mounted in a fixed position on one end of stationary slide 30.

Retainer mechanism 34 includes a mount unit 36, a lower retainer 38, and an upper retainer 40 as shown best in FIGS. 4 and 5. Each retainer 38, 40 includes a movable latch (e.g., 41 and 42, respectively). It is within the scope of this disclosure to mount latches 41, 42 to mount unit 36 to pivot, slide, or otherwise move relative to mount unit 36 during coupling and uncoupling of quick-mount support 11 and rack 18.

Mount unit 36 includes a retainer mount 52 coupled to slide support bracket 32 and a rack mount 54 arranged to lie at a right angle to retainer mount 52 as shown, for example, in FIGS. 4 and 5. In the illustrated embodiment, retainer mount 52 is established by a first metal plate welded or otherwise secured to a second metal plate establishing the rack mount 52. It is within the scope of this disclosure to form mount unit 36 of a monolithic metal or plastics material.

Figure 3:
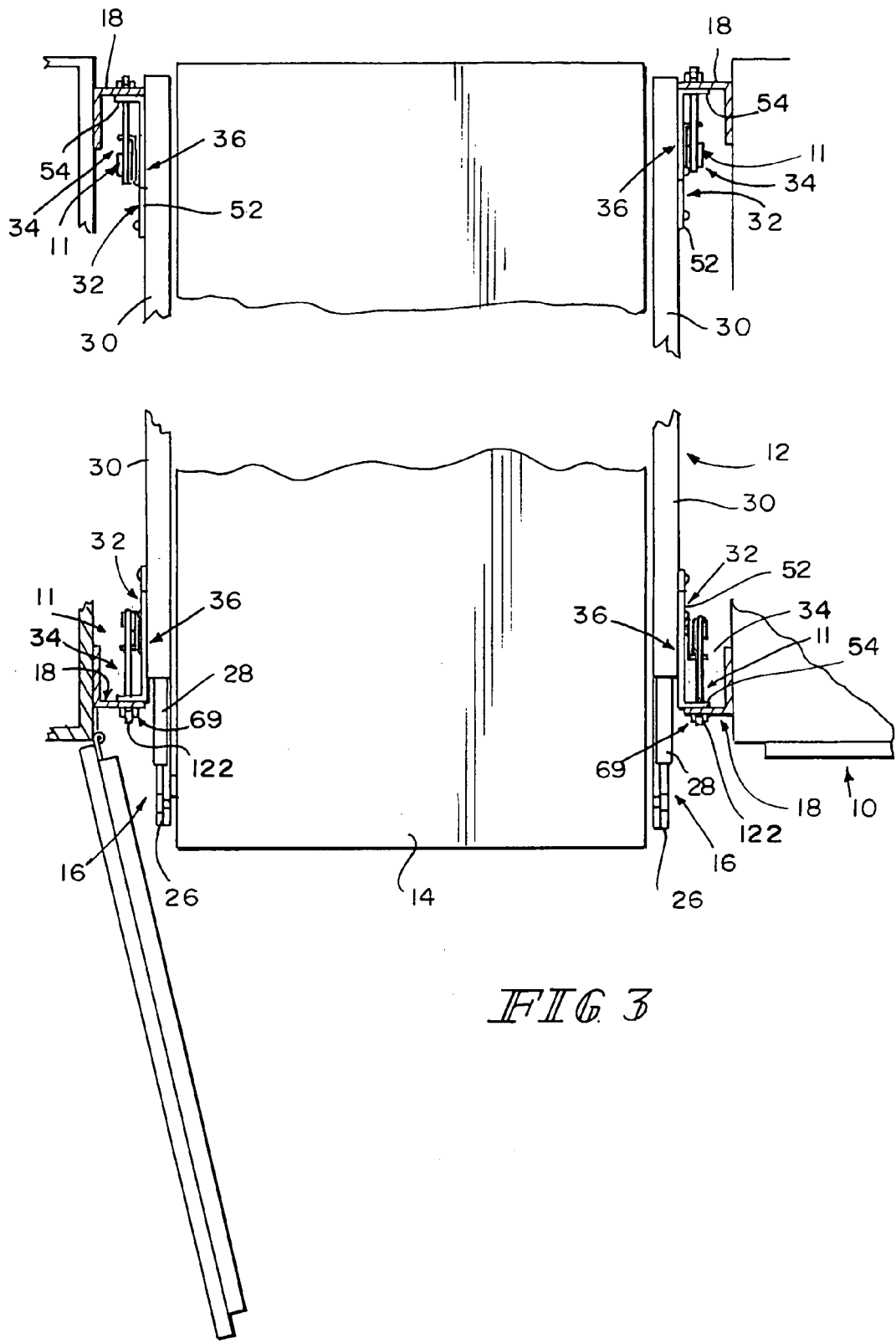
FIG. 3 is a sectional view taken along line 3—3 of FIG. 2 after the piece of equipment has been moved on the telescoping slide assemblies a short distance out of the cabinet showing a pair of spaced-apart three-part telescoping slide assemblies, a piece of equipment mounted there between, and four quick-mount supports and showing that each quick-mount support is coupled to one of the forward and rearward vertical racks and to a nearby portion of one of the telescoping slide assemblies to anchor the slide assemblies to the vertical racks.

Rack mount 54 is adapted to mate with rack 18 when quick-mount support 11 is coupled to rack 18 as suggested in FIGS. 3, 13, and 15. Rack mount 54 includes a forwardly facing surface 47 and a rearwardly facing surface 49. Forwardly facing surface 47 of rack mount 54 is arranged to lie in mating relation to rearwardly facing surface 22 of rack 18 to align latch apertures formed in rack 18 with various latch-receiving slots and channels formed in rack mount 54 as suggested in FIGS. 11 and 15. It is within the scope of this disclosure to place an intervening element between rack mount 54 and rack 18 so long as both of the movable latches 41, 42 are able to extend through and move in companion latch-receiving slots and channels formed in rack mount 54 and latch apertures formed in rack 18.

As suggested in FIG. 4, rack mount 54 of mount unit 36 is formed to include first and second slots 63, 68, a first alignment guide 64 associated with first slot 63, and a second alignment guide 69 associated with second slot 68. Alignment guides 64, 69 are used to orient quick-mount support 11 (and particularly rack mount 54) in a predetermined position relative to rack 18 as suggested in FIGS. 3, 13, and 15 to facilitate coupling of the quick-mount support 11 to the rack 18.

First alignment guide 64 is coupled to rack mount 54 of mount unit 36 and formed to include a first channel 65 communicating with first slot 63 in rack mount 54. In the illustrated embodiment, first alignment guide 64 comprises a pair of first tabs 66, 67 arranged to form first channel 65 therebetween. Second alignment guide 69 is coupled to rack mount 54 of mount unit 36 and formed to include a second channel 70 communicating with second slot 68 in rack mount 54. Also in the illustrated embodiment, second alignment guide 69 comprises a pair of second tabs 71, 72 arranged to form second channel 70 therebetween. Also in the illustrated embodiment, each of first tabs 66, 67 and second tabs 71, 72 has a partial cylindrical shape with an outwardly presented curved exterior surface and an inwardly presented flat interior surface. Pairs of tabs having such a shape cooperate to define a "split-cylinder" alignment guide. It is within the scope of this disclosure to vary the shape and number of tabs in each alignment guide.

As suggested in FIGS. 4 and 12–15, first alignment guide 64 is arranged to extend through latch aperture 23 formed in rack 18 and second alignment guide 69 is arranged to extend through latch aperture 25 formed in rack 18 so that rack mount 54 is oriented properly with respect to rack 18 to allow latches 41, 42 to extend into the slots and channels formed in rack mount 54 and latch apertures formed in rack 18. The outwardly presented curved exterior surfaces of first tabs 66, 67 fit into and mate with a circular inner edge of latch aperture 23. Likewise, the outwardly presented curved exterior surfaces of second tabs 71, 72 fit into and mate with a circular inner edge of latch aperture 25.

By inserting these alignment guides 64, 69 into two of the latch apertures (e.g., 23 and 25) formed in vertical rack 18, it is a simple matter for a technician to orient quick-mount support 11 on stationary slide 30 with rack 18 so that tips of movable latches 41, 42 are aligned and can be mated with rack 18 as suggested, for example, in FIGS. 11, 13, and 15 to "anchor" stationary slide 30 in a fixed position on rack 18.

As suggested in FIGS. 5 and 10–15, a "tip" 112 of bottom latch 41 extends through first slot 63 and first channel 65 associated with first alignment guide 64 and is movable therein from a first position lying within first channel 65 as shown in FIGS. 9 and 11–13 to a second position projecting outside first channel 65 as shown in FIGS. 5, 14, and 15. Likewise, a "tip" 122 of top latch 42 extends through second slot 68 and second channel 70 associated with second alignment guide 69 and is movable therein from a first position lying within second channel 70 as shown in FIGS. 9 and 11–13 to a second position outside second channel 70 as shown in FIGS. 5, 14, and 15.

As suggested in FIGS. 4 and 5, lower retainer 38 includes a pivotable bottom latch 41, a first pivot mount 80, and a first spring 81. First pivot mount 80 extends into a first mount aperture 84 formed in retainer mount 52 and carries first spring 81 to support bottom latch 41 for up and down pivotable movement about first pivot axis 85. Upper retainer 40 includes a pivotable top latch 42, a second pivot mount 82, and a second spring 83. Second pivot mount 82 extends into a second mount aperture 86 formed in retainer mount 52 and carries second spring 83 to support top latch 42 for up and down pivotable movement about second pivot axis 87.

In use, a movable bottom latch 41 is arranged to extend through a first (23) of the latch apertures formed in rack 18 and movable top latch 42 is arranged to extend through a second (25) of the latch apertures formed in rack 18 as suggested in FIGS. 14 and 15. First spring 81 is arranged to urge bottom latch 41 normally away from top latch 42. Second spring 83 is arranged to urge top latch 42 normally away from bottom latch 41. First spring 81 is arranged normally to pivot bottom latch 41 about the first latch pivot axis 85 in a counterclockwise direction 95 and second spring 83 is arranged normally to pivot top latch 42 about the second latch pivot axis 87 in a clockwise direction 96 as suggested in FIG. 6.

As suggested diagrammatically in FIG. 16, a force generator 100 is coupled to bottom and top latches 41, 42 and arranged to move latches 41, 42 away from one another so that bottom and top latches 41, 42 will mate with rack 18 to block uncoupling of quick-mount support 11 and rack 18. In the illustrative embodiment, springs 81 and 83 cooperate to define force generator 100. It is within the scope of this disclosure to use a single spring to define force generator 100.

In the illustrated embodiment, first spring 81 is coupled at one end 811 to mount unit 36 and at another end 812 to bottom latch 41. As suggested in FIG. 4, end 812 of first spring 81 is inserted into a first spring mount aperture 79 formed in retainer mount 52. As suggested in FIG. 5, end 811 of first spring 81 passes through a second spring mount aperture 88 formed in bottom latch 41 and mates with bottom latch 41. First spring 81 includes a coiled portion 813 wrapped around first pivot mount 80 and positioned to lie between retainer mount 52 of mount unit 36 and bottom latch 41.

Second spring 83 is coupled at one end 831 to mount unit 36 and at another end 832 to top latch 42. As suggested in FIG. 4, end 832 of second spring 83 is inserted into a second spring mount aperture 89 formed in retainer mount 52. As suggested in FIG. 5, end 831 of second spring 83 passes through a second spring mount aperture 90 formed in top latch 42 and mates with top latch 42. Second spring 83 includes a coiled portion 833 wrapped around second pivot mount 82 and positioned to lie between retainer mount 52 of mount unit 36 and top latch 42. Bottom latch 41 is mounted for pivotable movement about a first latch pivot axis 85 and top latch 42 is mounted for pivotable movement about a second latch pivot axis 87.

As suggested in FIG. 4, bottom latch 41 includes a base 110 intersecting first latch pivot axis 85 and providing an aperture 111 receiving a throat of first pivot mount 80, a latch lug 112 arranged to extend through the first (23) of the latch apertures formed in rack 18, and a mid-section 114 arranged to interconnect base 110 and latch lug 112 of bottom latch 41 and coupled to end 811 of first spring 81. Top latch 42 includes a base 120 intersecting second latch pivot axis 87 and providing an aperture 121 receiving a throat of second pivot mount 82, a latch lug 122 arranged to extend through the second (25) of the latch apertures formed in rack 18, and a mid-section 123 arranged to interconnect base 120 and latch lug 122 of top latch 42 and coupled to end 831 of second spring 83.

Bottom latch 41 is coupled to mount unit 36 and arranged to extend through first slot 63 formed in rack mount 54 and first channel 65 formed in first alignment guide 64 and through the first (23) of the series of latch apertures formed in rack 18 to block uncoupling of the quick-mount support 11 and rack 18 as shown in FIG. 15. Top latch 42 is coupled to mount unit 36 and arranged to extend through second slot 68 formed in rack mount 54 and second channel 70 formed in second alignment guide 69, and through the second (25) of the series of latch apertures to block uncoupling of quick-mount support 11 and 18 as shown in FIG. 15.

Bottom latch 41 is coupled for movement relative to mount unit 36 between an extended position shown in FIGS. 14 and 15 and a retracted position shown in FIGS. 11–13. In the extended position, a bottom latch lug 112 included in bottom latch 41 extends out of first channel 65 provided in the first alignment guide 64 to confront forwardly facing surface 20 of rack 18 so as to block removal of bottom latch 41 from the first (23) of the series of latch apertures formed in rack 18. In the retracted position, bottom latch lug 112 is located in (or within a zone defined by) first channel 65 provided in first alignment guide 64 so as to allow movement of bottom latch lug 112 and the pair of first tabs 66, 67 through the first (23) of the series of latch apertures. First spring 81 is arranged to urge bottom latch 41 normally to the extended position.

Top latch 42 is coupled for movement relative to mount unit 36 between an extended position shown in FIGS. 14 and 15 and a retracted position shown in FIGS. 11–13. In the extended position, a top latch lug 122 included in top latch 42 extends out of second channel 70 provided in second alignment guide 69 to confront forwardly facing surface 20 of rack 18 so as to block removal of top latch 42 from the second (25) of the series of latch apertures formed in rack 18. In the retracted position, top latch lug 122 is located in second channel 70 provided in second alignment guide 69 so as to allow movement of top latch lug 122 and the pair of second tabs 71, 27 through the second (25) of the series of latch apertures. Second spring 83 is arranged to urge top latch 42 normally to the extended position.

Use of a quick-mount support 11 to couple a stationary slide 30 of a telescoping slide assembly 16 to a rack 18 to assume a fixed position (of the type shown in FIGS. 1–3) is shown in FIGS. 10–15 with reference also to FIGS. 5 and 9. Prior to coupling, force generator 100 (e.g., springs 81, 83) cooperates to pivot bottom latch 41 to a "lowered and locked" position and to pivot top latch 42 to a "raised and locked" position shown in FIGS. 5, 6, and 11. It is within the scope of this disclosure to provide a single piece of spring material to cause such pivoting movement of bottom and top latches 41, 42. Referring now to FIG. 6, upward force 101 is applied (e.g., manually) to bottom latch 41 and downward force 102 is applied (e.g., manually) to top latch 42 to prepare latches 41, 42 to be coupled to rack 18. Such forces 101, 102 cooperate to move latches 41, 42 toward one another against biasing forces provided by force generator 100 (e.g., springs 81 and 83). In this "ready" position, latch lug 112 of bottom latch 41 lies in channel 65 formed in first alignment guide 64 as suggested in FIGS. 9 and 11–13 and is "poised" to be passed in direction 45 through latch aperture 23 of rack 18 along with first alignment guide 64. Also, latch lug 122 of top latch 42 lies in channel 70 formed in second alignment guide 69 as suggested in FIGS. 9 and 11–13 and is "poised" to be passed in direction 45 through latch aperture 25 of rack 18 along with second alignment guide 69.

Next, quick-mount support 11 and stationary slide 30 are moved as a unit in direction 45 as shown in FIG. 13. Such movement causes rack mount 54 to abut rearwardly facing surface 22 of rack 18, first alignment guide 64 and latch lug 112 to pass as a unit through latch aperture 23 in rack 18, and second alignment guide 69 and latch lug 122 to pass as a unit through latch aperture 25.

Then, application of forces 101, 102 is ended to "release" the spring-loaded bottom and top latches 41, 42 to allow spring 81 to pivot bottom latch 41 in counterclockwise direction 95 and to allow spring 83 to pivot top latch 42 in clockwise direction 96. This causes bottom latch 41 to be moved to assume a "lowered and locked" position to cause a portion of latch lug 112 to extend out of channel 65 formed in first alignment guide 64 to block removal of latch lug 112 from latch aperture 23. This also causes top latch 42 to be moved to assume a "raised and locked" position to cause a portion of latch lug 122 to extend out of channel 70 formed in second alignment guide 69 to block removal of latch lug 122 from latch aperture 25. In these positions, stationary slide 30 is held in a fixed position relative to rack 18 provided in cabinet 10.

As suggested in FIGS. 4, 14, and 15, quick-mount support 11 further includes a connector 97 arranged to pass through aligned apertures 24, 124 formed, respectively, in each of rack 18 and rack mount 54 to mate with connector mount 98. Aperture 124 can also have internal threads (not shown) to mate with connector 97 to omit mount 98. Fasteners 99a and 99b (e.g., "flat-head" countersink rivet or screw) can be used to couple retainer mount 52 to slide support bracket 32 as also suggested in FIG. 4.

What is claimed is:

1. A telescoping slide assembly support system comprising
a telescoping slide assembly including load-carrying and stationary slides movable relative to one another to extend and retract the load-carrying slide relative to the stationary slide between fully extended and retracted positions,
a rack formed to include a series of latch apertures, and
a quick-mount support coupled to the stationary slide, the quick-mount support including a movable bottom latch arranged to extend through a first of the latch apertures, a movable top latch arranged to extend through a second of the latch apertures, and a force generator coupled to the bottom and top latches and arranged to move the bottom and top latches away from one another while the bottom latch extends through the first of the latch apertures and the top latch extends through the second of the latch apertures to mate the bottom and top latches with the rack to block uncoupling of the quick-mount support and the rack.

2. The system of claim 1, wherein the force generator includes a first spring arranged to urge the bottom latch normally away from the top latch and a second spring arranged to urge the top latch normally away from the bottom latch.

3. The system of claim 2, wherein the quick-mount support further includes a mount unit coupled to the stationary slide, the first spring is coupled at one end to the mount unit and at another end to the bottom latch, and the second spring is coupled at one end to the mount unit and at another end to the top latch.

4. The system of claim 3, wherein the bottom latch is mounted on the mount unit for pivotable movement about a first latch pivot axis and the top latch is mounted on the mount unit for pivotable movement about a second latch pivot axis.

5. The system of claim 2, wherein the bottom latch is mounted for pivotable movement about a first latch pivot axis, the top latch is mounted for pivotable movement about a second latch pivot axis, the first spring is arranged normally to pivot the bottom latch about the first latch pivot axis in a counterclockwise direction, and the second spring is arranged normally to pivot the top latch about the second latch pivot axis in a clockwise direction.

6. The system of claim 5, wherein the quick-mount support includes a mount unit, a first pivot mount is coupled to the mount unit and to the bottom latch to establish the first latch pivot axis, a second pivot mount is coupled to the mount unit and to the top latch to establish the second latch pivot axis, the first spring includes a coiled portion wrapped around the first pivot mount and positioned to lie between the mount unit and the bottom latch, and the second spring includes a coiled portion wrapped around the second pivot mount and positioned to lie between the mount unit and the top latch.

7. The system of claim 5, wherein the bottom latch includes a base intersecting the first latch pivot axis, a latch lug arranged to extend through the first of the latch apertures, and a mid-section arranged to interconnect the base and latch lug of the bottom latch and coupled to the first spring, and the top latch includes a base intersecting the second latch pivot axis, a latch lug arranged to extend through the second of the latch apertures, and a mid-section arranged to interconnect the base and latch lug of the top latch and coupled to the second spring.

8. The system of claim 1, wherein the quick-mount support further includes a mount unit formed to include first and second slots and a first alignment guide coupled to the mount unit and formed to include a first channel communicating with the first slot, the first alignment guide is arranged to extend through a first of the series of latch apertures, and one of the bottom and top latches is arranged to extend through the first slot and into the first channel and is coupled to the mount unit for pivotable movement about a pivot axis between an extended position wherein a latch lug included in the one of the bottom and top latch extends out of the first channel to confront the rack so as to block removal of the one of the bottom and top latches from the first of the series of latch apertures formed in the rack and a retracted position wherein the latch lug is located in the first channel to allow movement of the first alignment guide and the one of the bottom and top latches through the first of the series of latch apertures.

9. The system of claim 1, wherein the quick-mount support further includes a mount unit formed to include first and second slots, a first alignment guide formed to include a first channel and arranged to extend through a first of the series of latch apertures formed in the rack, and a second alignment guide formed to include a second channel and arranged to extend through a second of the series of latch apertures formed in the rack, the movable bottom latch extends through and is movable in the first slot and channel, and the movable top latch extends through and is movable in the second slot and channel.

10. A telescoping slide assembly support system comprising
a telescoping slide assembly including load-carrying and stationary slides movable relative to one another to extend and retract the load-carrying slide relative to the stationary slide between fully extended and retracted positions,
a rack formed to include a series of latch apertures, and
a quick-mount support coupled to the stationary slide, the quick-mount support including a mount unit formed to include a first slot and a second slot, a first alignment guide comprising a pair of first tabs appended to the mount unit to form a first channel therebetween opening into the first slot, a second alignment guide comprising a pair of second tabs appended to the mount unit to form a second channel therebetween opening into the second slot, the pair of first tabs extending through a first in the series of latch apertures and the pair of second tabs extending through a second in the series of latch apertures to orient the quick-mount support in a predetermined position relative to the rack, a first spring coupled to the mount unit, a bottom latch coupled to the mount unit and arranged to extend through the first slot, first channel, and first of the series of latch apertures, a second spring coupled to the mount unit, and a top latch coupled to the mount unit and arranged to extend through the second slot, second channel, and second of the series of latch apertures and urged yieldably by the second spring to move away from the bottom latch to block uncoupling of the quick-mount support and the rack, the bottom latch being arranged to be urged yieldable by the first spring to move away from the top latch to block uncoupling of the quick-mount support and the rack.

11. The system of claim 10, wherein the bottom latch is coupled for movement relative to the mount unit between an extended position wherein a bottom latch lug included in the bottom latch extends out of the first channel provided in the first alignment guide to confront the rack so as to block removal of the bottom latch from the first of the series of latch apertures formed in the rack and a retracted position wherein the bottom latch lug is located in the first channel provided in the first alignment guide so as to allow movement of the bottom latch lug and the pair of first tabs through the first of the series of latch apertures.

12. The system of claim 11, wherein the first spring is arranged to urge the bottom latch normally to the extended position.

13. The system of claim 11, wherein the top latch is coupled for movement relative to the mount unit between an extended position wherein a top latch lug included in the top latch extends out of the second channel provided in the second alignment guide to confront the rack so as to block removal of the top latch from the second of the series of latch apertures formed in the rack and a retracted position wherein the top latch lug is located in the second channel provided in the second alignment guide so as to allow movement of the top latch lug and the pair of second tabs through the second of the series of latch apertures.

14. The system of claim 13, wherein the first spring is arranged to urge the bottom latch normally to the extended position and the second spring is arranged to urge the top latch normally to the extended position.

15. A telescoping slide assembly support system comprising
a telescoping slide assembly including load-carrying and stationary slides movable relative to one another to extend and retract the load-carrying slide relative to the stationary slide between fully extended and retracted positions,
a rack formed to include a series of latch apertures, and
a quick-mount support coupled to the stationary slide, the quick-mount support including a mount unit including a rack mount formed to include first and second slots and adapted to mate with the rack to align the first and second slots with latch apertures formed in the rack, a latch mount arranged to extend away from the rack and formed to include a guide slot, a first alignment guide coupled to the rack mount and formed to include a first channel communicating with the first slot, and a second alignment guide coupled to the rack mount and formed to include a second channel communicating with the second slot, a bottom latch coupled to the latch mount for pivotable movement about a first pivot axis and arranged to extend through the first slot, first channel, and a first of the series of latch apertures, a top latch coupled to the latch mount for pivotable movement about a second pivot axis and arranged to extend through the second slot, second channel, and a second of the series of latch apertures, a force generator coupled to the latch mount and arranged to pivot the bottom and top latches normally away from one another to mate the bottom and top latches with the rack to block uncoupling of the quick-mount support and the rack.

* * * * *